(12) United States Patent
Liu et al.

(10) Patent No.: US 7,767,272 B2
(45) Date of Patent: Aug. 3, 2010

(54) METHOD OF PRODUCING COMPOUND NANORODS AND THIN FILMS

(75) Inventors: Bing Liu, Ann Arbor, MI (US);
Zhendong Hu, Ann Arbor, MI (US);
Yong Che, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 319 days.

(21) Appl. No.: 11/754,031

(22) Filed: May 25, 2007

(65) Prior Publication Data

US 2008/0292808 A1    Nov. 27, 2008

(51) Int. Cl.
*B05D 3/00* (2006.01)
*C08J 7/18* (2006.01)
*G21H 5/00* (2006.01)

(52) U.S. Cl. .................. 427/554; 427/453; 136/252
(58) Field of Classification Search .............. 427/554, 427/453; 136/252
See application file for complete search history.

(56) References Cited

U.S. PATENT DOCUMENTS

| | | | |
|---|---|---|---|
| 5,780,120 | A * | 7/1998 | Belouet et al. .............. 427/554 |
| 5,897,945 | A | 4/1999 | Lieber et al. |
| 6,036,774 | A | 3/2000 | Lieber et al. |
| 6,225,198 | B1 | 5/2001 | Alivisatos et al. |
| RE37,585 | E | 3/2002 | Mourou et al. |
| 6,720,240 | B2 | 4/2004 | Gole et al. |
| 2006/0134883 | A1 * | 6/2006 | Hantschel et al. .......... 438/458 |
| 2008/0157031 | A1 * | 7/2008 | Goldberger et al. ...... 252/519.4 |

OTHER PUBLICATIONS

Amoruso et al. (Physical Review B 71, 033406 (2005), pp. 1-4).*
Tjong (Nanocrystalline Materials, Elsevier internet homepage, http://www.elsevier.com, Amsterdam, 2006, pp. 95-99).*
Wang et al. (Journal of Vacuum Science and Technology, B 24(3), May 2006, pp. 1230-1233).*
A. M. Morales et al., "*A Laser Ablation Method of the Synthesis of Crystalline Semiconductor Nanowires*," Science, www.sciencemag.org, vol. 279 (Jan. 9, 1998), pp. 208-211.
L. C. Chen et al., "*Catalyst Free and Controllable Growth of $SiC_xN_y$ Nanorods*," Journal of Physics and Chemistry of Solids, vol. 62 (2001), pp. 1567-1576.
A. V. Bulgakov et al., "*Cluster Emission Under Femtosecond Laser Ablation of Silicon*," Thin Solid Films, www.sciencedirect.com, vols. 453-454, (2004), pp. 557-561.

(Continued)

*Primary Examiner*—Nadine G Norton
*Assistant Examiner*—Mahmoud Dahimene
(74) *Attorney, Agent, or Firm*—Sughrue Mion, PLLC

(57) ABSTRACT

A method of producing compound nanorods and thin films under a controlled growth mode is described. The method involves ablating compound targets using an ultrafast pulsed laser and depositing the ablated materials onto a substrate. When producing compound nanorods, external catalysts such as pre-deposited metal nanoparticles are not involved. Instead, at the beginning of deposition, simply by varying the fluence at the focal spot on the target, a self-formed seed layer can be introduced for nanorods growth. This provides a simple method of producing high purity nanorods and controlling the growth mode. Three growth modes are covered by the present invention, including nanorod growth, thin film growth, and nano-porous film growth.

24 Claims, 8 Drawing Sheets

OTHER PUBLICATIONS

E. G. Gamaly et al., *"Control Over A Phase State of The Laser Plume Ablated by Femtosecond Laser: Spatial Pulse Shaping,"* Journal of Applied Physics, vol. 95, No. 5, (Mar. 1, 2004), pp. 2250-2257.

S. Amoruso et al., *"Femtosecond Laser Pulse Irradiation of Solid Targets As A General Route to nanoparticle Formulation in A Vacuum,"* Physical Review B, vol. 71 (2005), pp. 033406-1/003406-4.

Alex A. Puretzky et al., *"Investigation of Single Wall Carbon Nanotube Growth By Time-Restricted Laser Vaporization,"* Physical Review B, vol. 65 (2002), pp. 245425-1/245425-9.

D. Du et al., *"Laser Induced Breakdown By Impact Ionization in $SiO_2$ With Pulse Widths from 7 ns to 150 fs"*, Applied Physics Letters, vol. 64 (Jun. 6, 1994), pp. 3071-3073.

T. G. Dietz et al., *"Laser Production of Supersonic Metal Cluster Beams,"* J. Chem. Phys., vol. 74, (1981), pp. 6511-6512.

T. Seto et al., *"Laser Synthesis of Uniform Silicon Single Nanodots"*, Nano. Lett. 1, vol. 1, No. 6, (2001) pp. 315-318.

W. I. Park et al., *"Metalorganic Vapor-Phase Epitaxial Growth of Vertically Well Aligned ZnO Nanorods,"* Applied ZnO Nanorods, Applied Physics Letters, vol. 80, No. 22, (Apr. 4, 2002), pp. 4232-4234.

B. Liu et al., *"Nanoparticle Generation in Ultrafast Laser Ablation of Nickel,"* Applied Physics Letters, vol. 90 (2007), pp. 044103-1/044103-3.

S. C. Tjong ed., *"Nanocrystalline Materials: Their Synthesis-Structure-Property Relationships and Applications,"* Elsevier Internet Hompage, http://www.elsevier.com, Amsterdam, 2006, pp. 95-99.

W. Lu et al., *"Semiconductor Nanowires,"* Journal of Physics D: Applied Physics, vol. 39 (2006), R387-R406.

M. Hirasawa et al., *"Size Dependent Crystallization of Si Nanoparticles,"* Appl. Phys. Lett. 88, (2006), pp. 093119-1/093119-3.

S. Eliezer et al., *"Synthesis of Nanoparticles with Femtosecond Laser Pulses,"* Physical Review B, vol. 69 (2004), pp. 144119-1/144119-6.

R. S. Wagner et al., *"VaporLliquid-Solid Mechanism of Single Crystal Growth,"* Applied Physics letters, vol. 4, No. 5, (Mar. 1, 1964), pp. 89-90.

\* cited by examiner

METHOD OF PRODUCING COMPOUND NANORODS AND THIN FILMS

FIELD OF INVENTION

This invention relates to growth of compound nanomaterials and thin films using ultrafast pulsed laser ablation and deposition.

BACKGROUND OF THE INVENTION

Nanomaterials have important potential applications in modern technologies. Depending on the number of spatial dimensions on which the material expands beyond the nanoscale, nanomaterial can be classified as zero-dimensional (nanoparticles), one-dimensional (nanorods and nanowires), and two-dimensional (nanosheets and nanometer thin films). For each of these categories of nanomaterials, the synthesis methods are different. For example, nanoparticles are often produced using the sol-gel process; nanorods are often produced using the vapor-liquid-solid (VLS) process [S. Wagner and W. C. Ellis, Applied Physics Letters, Vol. 4 (1964), 89; A. M. Morales and C. M. Lieber, Science, Vol. 279 (1998), 208; W. Lu, C. M. Lieber, Journal of Physics D: Applied Physics, Vol 39 (2006), R387, S. C. Tjong ed., Nanocrystalline Materials, Elsevier, Amsterdam, 2006, pp 95 and U.S. Pat. No. 5,897,954, U.S. Pat. No. 6,036,774, U.S. Pat. No. 6,225,198], which involves pre-deposited metal (such as gold) particles as a catalyst to induce nanorod growth; and nanometer thin films are often grown by epitaxy methods such as molecular beam epitaxy (MBE) and chemical vapor deposition (CVD). Regarding the VLS method that is commonly used for growth of nanorods and nanowires, because the pre-deposited metal catalyst can bring in an undesirable impurity for many applications (for example, gold is detrimental to silicon devices), many attempts have been tried to develop non-catalytic or self-catalytic (i.e., using the same material intended for growth as the catalyst) growth methods. Examples are U.S. Pat. No. 6,225,198, U.S. Pat. No. 6,720,240, and W. I. Park et al., Applied Physics Letters, Vol 80 (2002), 4232, L. C. Chen et al., Journal of Physics and Chemistry of Solids, Vol 62 (2001), 1567.

On the other hand, for material growth, regardless of the intended final morphological forms, a means of producing gaseous or liquid phase source material is always needed. Among the various methods of producing gaseous source materials (e.g., thermal evaporation or using chemical precursors), pulsed laser ablation (PLA) is a relatively new method. In this technique, a pulsed laser beam is focused on to a target surface to ablate materials. Typical lasers used for ablation include Q-switched Nd:YAG and excimer lasers, which can provide pulses with a pulse energy of a few hundreds of mJ and a pulse duration of a few nanoseconds. Because of the short pulse duration, the peak power is very high. Under such intense laser irradiation, the target surface material is inevitably evaporated. The resultant vapor is often ionized, appearing bright, and is thus called plume. The vapor can then be deposited onto a substrate to form new forms of materials. This constitutes the basics of the technique of pulsed laser deposition (PLD). FIG. 1 illustrates the PLD setup used in the current invention.

The most widely pursued morphological form of the deposited material using PLD is two-dimensional thin film. Nanoparticles have also been generated by supplying a background gas with a high pressure (a few Torr) during ablation to force particle nucleation in the laser-induced vapor [T. G. Dietz et al., J. Chem. Phys. 74, 6511 (1981), T. Seto et al., Nano. Lett. 1, 315 (2001), M. Hirasawa et al., Appl. Phys. Lett. 88, 093119 (2006)]. The particles can then be carried by a carrier gas to a substrate. Using metal particles as catalysts and PLA as the evaporation source, semiconductor nanorods have been produced in an essentially VLS (vapor-liquid-solid) fashion [A. M. Morales and C. M. Lieber, Science, Vol. 279 (1998), 208; W. Lu, C. M. Lieber, Journal of Physics D: Applied Physics, Vol 39 (2006), R387; S. C. Tjong ed., Nanocrystalline Materials, Elsevier, Amsterdam, 2006, pp 97].

Using very high power pulsed lasers (with pulse energy greater than 1 J/pulse), carbon nanotubes have been produced in large quantities [Alex A. Puretzky et al., Physical Review B, Vol 65 (2002), 245425].

One drawback of high power nanosecond PLD is the generation of micron scale liquid droplets, which is mainly a result of liquid splashing and collateral damage of the target near the focal spot due to the high pulse energy. These large droplets introduce undesirable inhomogeneity to the deposition, especially in thin film growth.

In comparison to nanosecond pulsed lasers, ultrafast pulsed lasers (with a pulse duration ranging from sub-picosecond to a few picoseocnds), when used for ablation and material deposition, have the advantage of a much lower ablation threshold [by an order of magnitude, [D. Du et al., Applied Physics Letters, Vol 64 (1994), 3071 and U.S. Pat. No. RE 37,585]] and a resultant potential of droplet-free growth [E. G. Gamaly et al., Journal of Applied Physics, Vol 95 (2004), 2250]. The very low ablation threshold is in principle because of two reasons. First, the extremely short pulse duration means a much higher peak power. Second, because the pulse duration is shorter than the typical time scales of electron-lattice interaction and heat conduction, the heat-affected zone in ultrafast pulsed laser ablation does not extend beyond the laser focal spot. This further increases the energy density at the focal spot. Because of the much reduced size of the melt pool and collateral damage, generation of large liquid droplets can in principle be suppressed. These characteristics have made ultrafast pulsed laser ablation an emerging technology of precise laser machining and material deposition.

SUMMARY OF THE INVENTION

The present invention first provides a method of growing compound nanorods using ultrafast PLD (pulsed laser deposition) without involving external catalysts. A slight variation of this method can provide a way of switching the growth mode between nanorod growth and thin film growth. Regarding the growth mode, in the rest of the text, 1D (i.e., one-dimensional, vertical) and 2D (i.e., two-dimensional, lateral) growth are also used to refer to nanorod and thin film growth, respectively. In addition, a nanoscale porous film growth mode can also be achieved, as will be described in detail in the next section.

Although ultrafast PLD is expected to have the potential of material deposition free of large (micron scales) droplets, as introduced above, in practice, it has been found that even when the ablation is performed in vacuum, the ablation plume automatically contains much smaller particles on nanoscales [A. V. Bulgakov et al., Thin Solid Films, Vol 453 (2004), 557, S. Eliezer et al., Physical Review B, Vol 69 (2004), 144119, S. Amoruso et al., Physical Review B, Vol 71 (2005), 033406]. The inventors of the present invention have found that by controlling the laser fluence below a threshold of strong plasma formation and by providing a background gas of low pressure (<100 mTorr), ultrafast pulsed laser ablation can be an efficient method of generating single-crystalline and polycrystalline nanoparticles [B. Liu et al., Applied Physics Letters, Vol 90 (2007), 044103]. Only when the laser fluence is above the threshold of strong plasma formation the ablated material is nearly fully vaporized. These observations suggest a way of controlling the growth mode and the film morphology in ultrafast PLD.

Basically the nanorod growth involves two steps with different laser fluences. At the beginning of deposition, a thin layer of nanoparticles is first deposited by using a low laser fluence. Under this condition, the ablated material contains a large fraction of nanoparticles, and the deposited layer is a nanoparticle aggregation. After annealing, the crystallinity of this layer is improved and can serve as a seed layer to induce nanorod growth. The laser fluence is then increased to a high fluence (above the plasma threshold) to fully vaporize the ablated material. This can serve as the vapor source for the subsequent nanorod growth. FIG. 2 illustrates this two step growth method.

A slight variation of the above method can switch the growth mode to 2D thin film growth. This is realized by using the same high laser fluence throughout both growth steps. In practice, for many film/substrate systems that have large lattice mismatch between the film and substrate (e.g., ZnO/sapphire), while maintaining the same high laser fluence that can fully vaporize the source material, the first step will be performed at a low substrate temperature, providing a buffer layer. At the second step, the substrate temperature can be raised to grow the main layer. In this way, a 2D growth mode can be achieved.

A third mode can be realized to grow nanoporous films. This mode utilizes the residual amount of small particles in the ablation plume while using a medium to high laser fluence, and heating the substrate to a high temperature during growth. Examples are given for each of these growth modes.

DESCRIPTION OF THE DRAWING FIGURES

FIG. 1 is an illustration of the setup used in the current invention, including vacuum chamber 1, laser beam 2 focusing lens 3, targets 4, target manipulator 5, substrate and heater 6, substrate manipulator 7, ion probe 8 and gas inlet 9. Unlabeled parts include viewports and vacuum pumps.

FIG. 2 is an illustration of the two-step growth method for nanorod growth. The laser beam used in step one produces a low fluence on the target surface. The laser beam used in step two produces a high fluence on the target surface. Nanoparticles 10 are automatically formed during low fluence ultrafast laser ablation. Seed layer 11 is formed by deposition of the nanoparticles 10. A nearly fully vaporized plume 12 can be formed during high fluence ultrafast laser ablation.

FIG. 3 is an AFM image showing the nanoparticles deposited at a low laser fluence of 0.5 J/cm$^2$. The image size is 2 µm×2 µm.

FIG. 4(a) illustrates the dependence of plume ion current on the laser fluence, taken during ablation of ZnO. The filled squares are for p-polarization of the laser beam. Below the fluence $F_{th}$ at 0.6 J/cm$^2$, the ion signal becomes nearly vanishing. However, significant amounts of nanoparticles can still be produced.

FIG. 4(b) is a transient waveform of the ion signal of ablation plume. This measurement represents the time for the ions to fly from the target to the ion detector, and can provide an estimation of the speed and kinetic energy of the plume ions. The fluence of the laser for this measure is 2 J/cm$^2$.

FIG. 5 is an XPS spectrum of the nitrogen 1 s level in a ZnO nanorod sample. The dot-dashed line is the plot of the original data. The thick line is after curve smoothing.

DETAILED DESCRIPTION OF THE INVENTION

Figure 1:
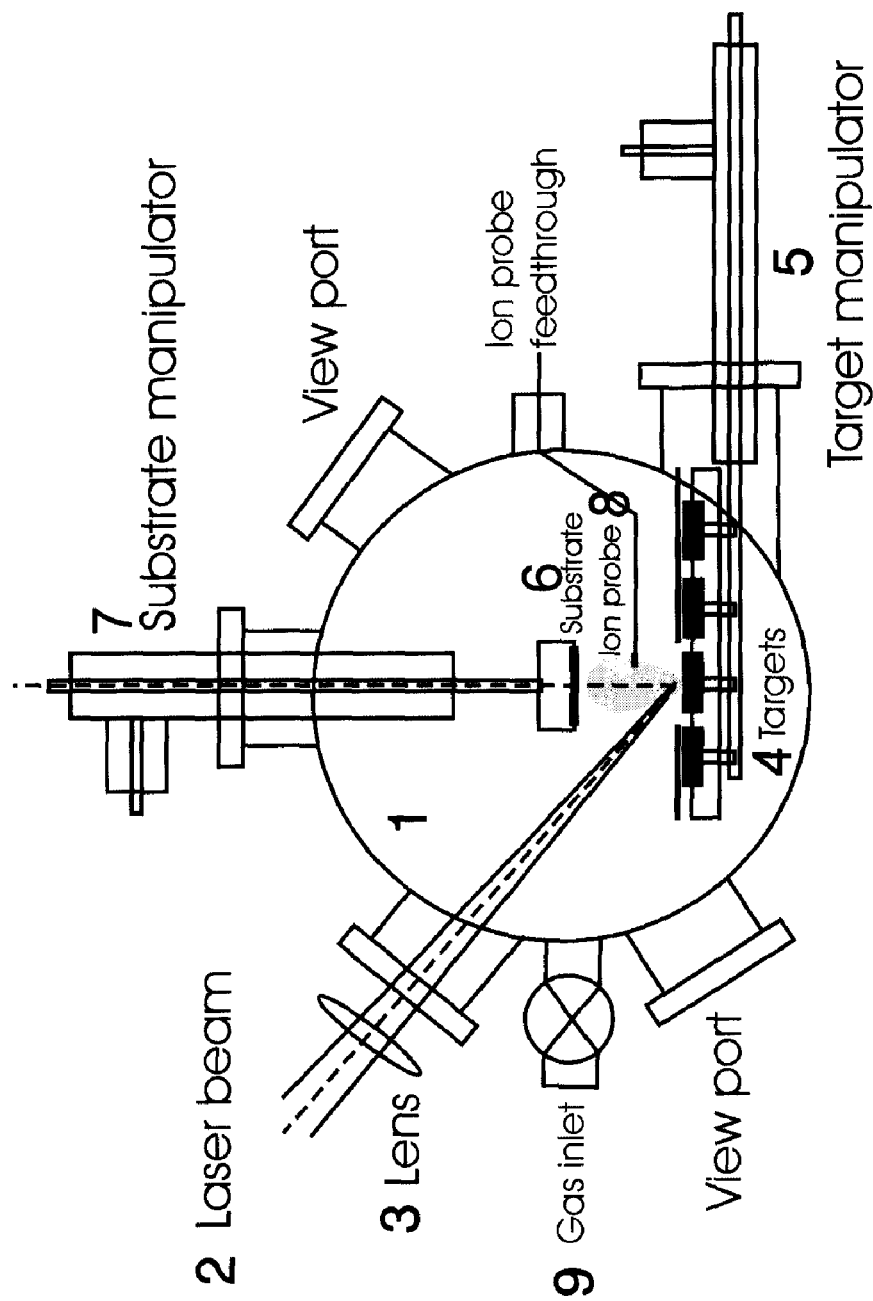

FIG. 1 illustrates the experimental setup of ultrafast pulsed laser ablation used in this invention. The system basically includes a vacuum chamber for deposition (base pressure $1\times10^{-6}$ Torr) and an ultrafast pulsed laser for ablation. The chamber contains a target manipulator, a substrate manipulator, and an ion probe. Four disk-like targets can be mounted on the target manipulator. During ablation, the targets rotate and move laterally (i.e., in the target surface plane) back and forth. To improve deposition uniformity, the substrate can also rotate and move in its surface plane. The substrate heater can supply a temperature up to 1000° C. The laser used in the experiments has a pulse duration of 500 fs, a central wavelength of 1.03 µm, a pulse energy up to 100 µJ, and a repetition rate up to several hundreds of kHz. The laser is focused using a lens onto the target surface through a fused silica window. During ablation, a biased charge probe can be inserted in front of the plume to collect ions or electrons, depending on the polarity of the bias. Gases can also be supplied to the chamber during growth.

ZnO is used as a sample material in the examples below, wherein the target is a solid disk made of ZnO ceramic. But this invention is not limited to ZnO. The method can be applied to other compound materials as well, such as other metal oxides, nitrides (e.g., AlN, GaN, InN), phosphides (e.g., GaP, InP), and arsenides (e.g., GaAs, InAs). Also, pure metal targets can also be used such that the ablated metal can react with reactive gases supplied in the background. Examples of reactive gases are $O_2$, $N_2$, $NH_3$, NO, $NO_2$, $N_2O$. These gases can be supplied either in their neutral form or in a plasma form.

Example of Nanorod Growth

ZnO is used as a sample compound material to illustrate the present invention. The target is a polycrystalline ZnO ceramic disk, made of ZnO powder by high pressure pressing and high temperature sintering. The target density is over 97%. The substrates are sapphire (0001). This is a representative and well-known lattice-mismatched system with a large mismatch of 32% between the film and substrate. Before growth, the substrate is first out gassed at 400° C. and exposed to an oxygen plasma to clean the hydrocarbon contaminants.

In the conventional nanorod growth using metal catalysts, it has been well-understood that the metal (typically Au) nanoclusters first form a binary alloy with Zn at the beginning of growth, and the alloyed particles trigger ZnO nanorod growth by oxidation of the segregated Zn at the alloy nanoparticles. For catalyst-free growth of ZnO nanorods, a comprehensive and unanimous understanding of the growth mechanism is still lacking among different growers. In our practice of ultrafast PLD, we have found two critical factors that enable the growth of ZnO nanorod free of external catalyst. The first factor is a polycrystalline seed layer, which is produced by deposition using a low laser fluence and brief annealing; the second factor is a background gas mixture of oxygen and nitrogen. The growth procedure and the two critical factors are described in detail below.

Figure 3:
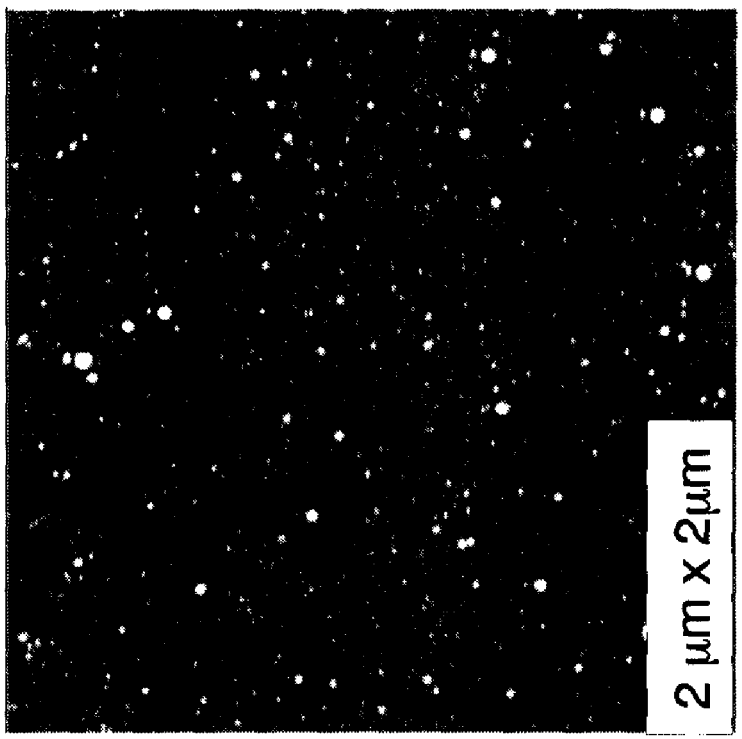
Figure 4:
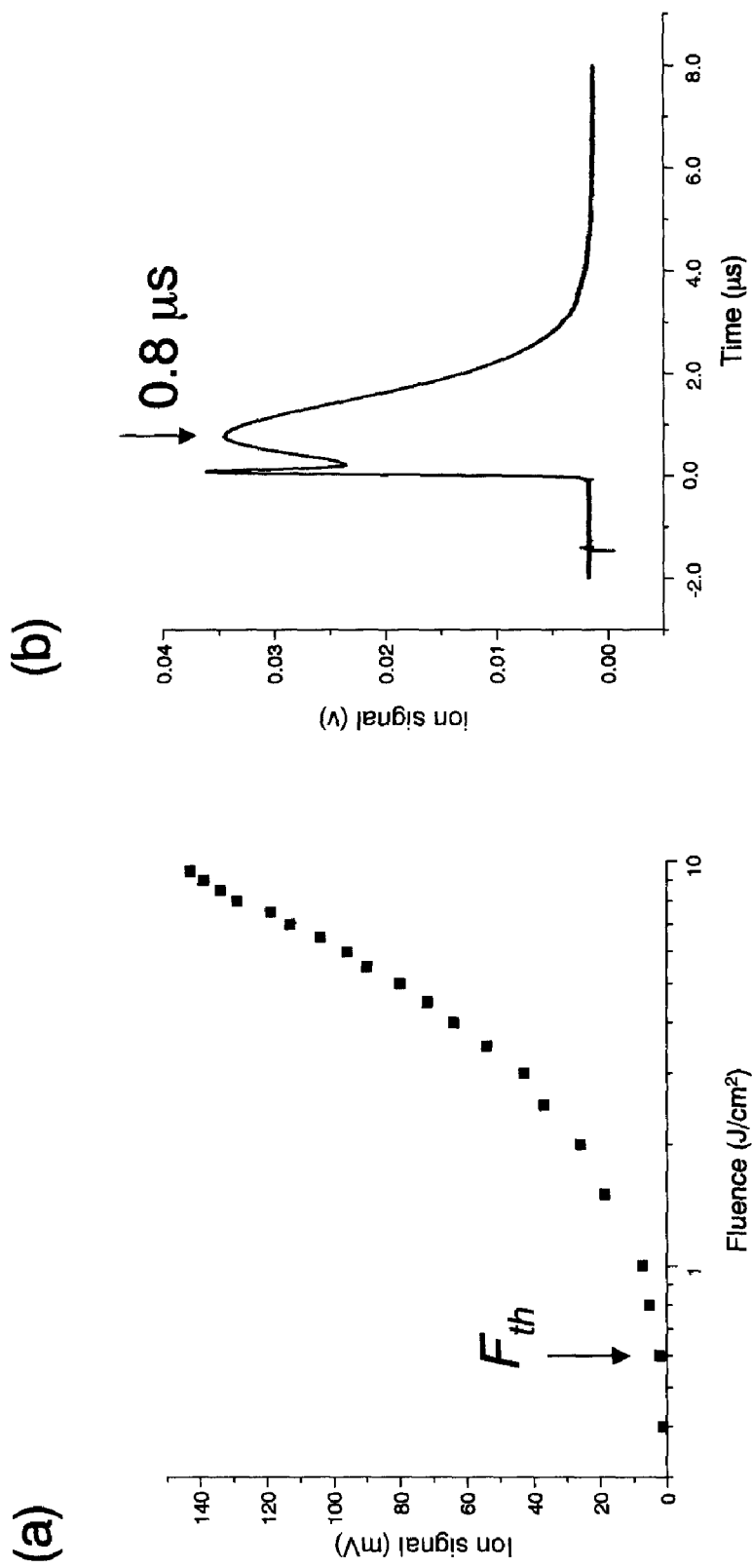

For depositing the seed layer, a low laser fluence is typically used. There are several equivalently effective ways of reducing the laser fluence, for example, reducing the pulse energy using a neutral filter or a polarizer beam splitter, or using an aperture to clip the laser beam diameter. FIG. 3 displays an AFM image of ZnO nanoparticles procuded by using a fluence of 0.5 J/cm$^2$. The average particle size is about 8 nm. The reason we choose this low fluence is as follows. FIG. 4(a) shows the ion signal dependence on the laser fluence taken during ablation of a ZnO target. It can be seen that below 0.6 J/cm$^2$, the ion signal becomes nearly vanishing, and above 0.6 J/cm$^2$, the ion signal increases very fast, indicating that for ZnO, 0.6 J/cm$^2$ is related to a threshold fluence (referred to as $F_{th}$ in the rest of the text), across which the ablation mechanism becomes different. As reported in the inventors' article [B. Liu et al., Applied Physics Letters, Vol 90 (2007), 044103], we find that below this threshold, even though the ablation appears to be very weak in ion signal (and plume brightness), a significant amount of nanoparticles are produced, as exemplified in FIG. 3, which is a result of deposition of only one minute. After elongated deposition ($\geq$10 min), the deposited layer will become an aggregation of nanoparticles. After annealing at an elevated temperature ($\geq$500° C.) for 10-20 min to improve the crystallinity, this layer can serve as a seed layer for nanorod growth.

There are several possible mechanisms by which the seed layer induces 1D nanorod growth. One possibility is that the nanoparticles in the seed layer, after annealing, can become rich in Zn. Another possibility is that in a polycrystalline compound layer, the grain boundaries often contain segregated ingredients of the compound, such as Zn segregating from ZnO. In both cases, the Zn-rich parts can become 'self-catalysts' for the nanorod growth. In this way, the use of external catalyst such as gold is avoided, and the deposition procedure becomes simpler and the resultant material has high purity.

Figure 2:
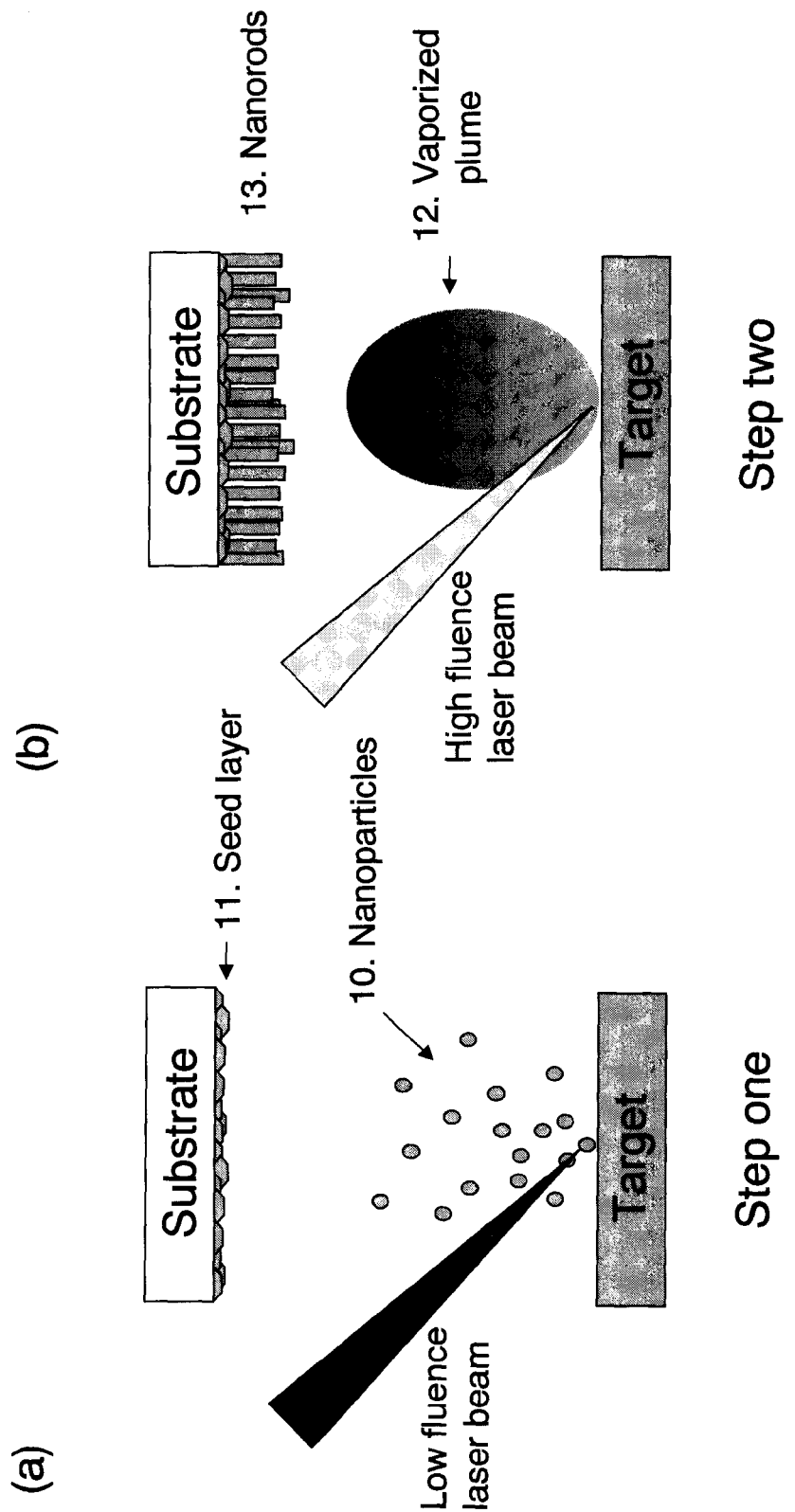

After preparing the seed layer, the nanorod growth can be initiated by raising the laser fluence to several times the plasma formation threshold to fully vaporize the ablated material, as illustrated in FIG. 2(b). The substrate temperature can be set at $\geq$500° C. Note that 500° C. is a much lower growth temperature compared with the temperature used in other growth methods such as MBE and CVD. The reason is because that in PLD, the adatoms coming from the ablation plume are already very mobile due to the explosive fashion of ablation. The possibility of using a low growth temperature can be an advantage for many applications, for example, the growth can be performed on substrates that can not sustain high temperatures, such as glass.

For the nanorod growth, we also find that a background gas mixture of oxygen and nitrogen is indispensable. All our successful growth of nanorods are obtained when a mixture of oxygen ($\geq$1 militorr) and nitrogen (1-20 militorr) are supplied in the chamber background. Replacing the nitrogen with argon or oxygen has not rendered nanorod growth. Our current understanding is that nitrogen radicals must have been generated during ultrafast laser ablation, and these radicals modify the ZnO surface energy anisotropy during growth, for example, by lowering the surface energy of certain planes of ZnO and promoting a more faceted growth (i.e., with more planes exposed).

Figure 5:
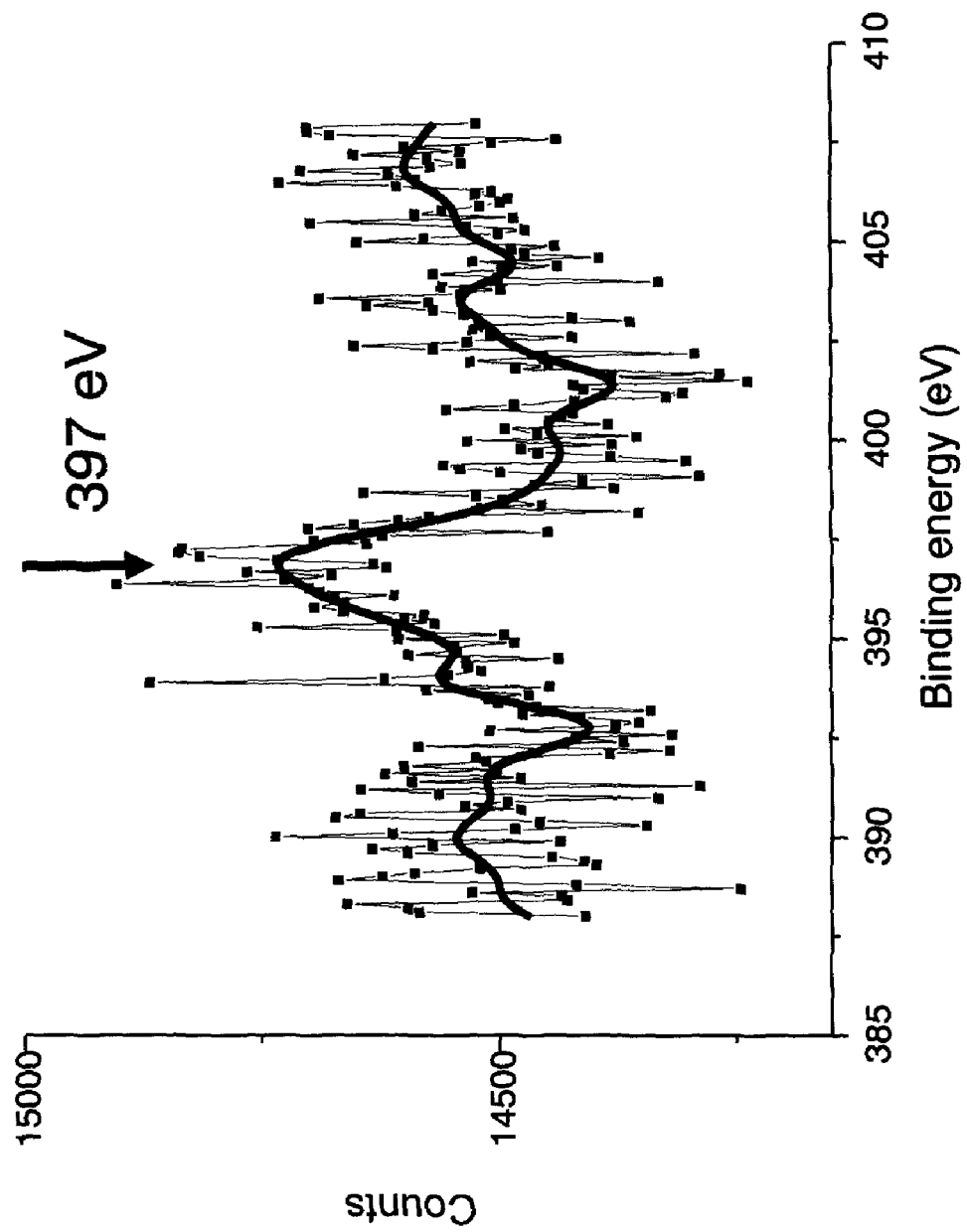

Regarding the source of the nitrogen radicals, we believe it must have come from the excitation by the highly energetic ultrafast laser ablation plume. As exemplified in FIG. 4(b), the peak time for the plume ions to reach the ion detector (3 cm away from the target) is only 0.8 micro second, which means an average kinetic energy of the plume ions of 0.8 keV (assuming Zn$^+$). (The ions in the leading edge of the plume can have higher kinetic energy.) These energetic ions in the plume can cause impact ionization and disassociation of the neutral nitrogen molecules in the background. FIG. 5 displays an XPS spectrum of the nitrogen is state taken from a ZnO nanorod sample. A peak at 397 eV is discernable after curve smoothing. According to reference texts, a nitrogen is peak at 397 eV indicates the existence of $N_O$, i.e., nitrogen substituting oxygen in ZnO. This peak is not observed for samples grown without introducing background nitrogen. It is worth noting that elemental nitrogen is also a well-known candidate dopant in making p-type ZnO. Our observations (e.g., the XPS measurement) suggest that neutral nitrogen can be radicalized during ultrafast pulsed ablation and can serve as a doping source.

Figure 6:
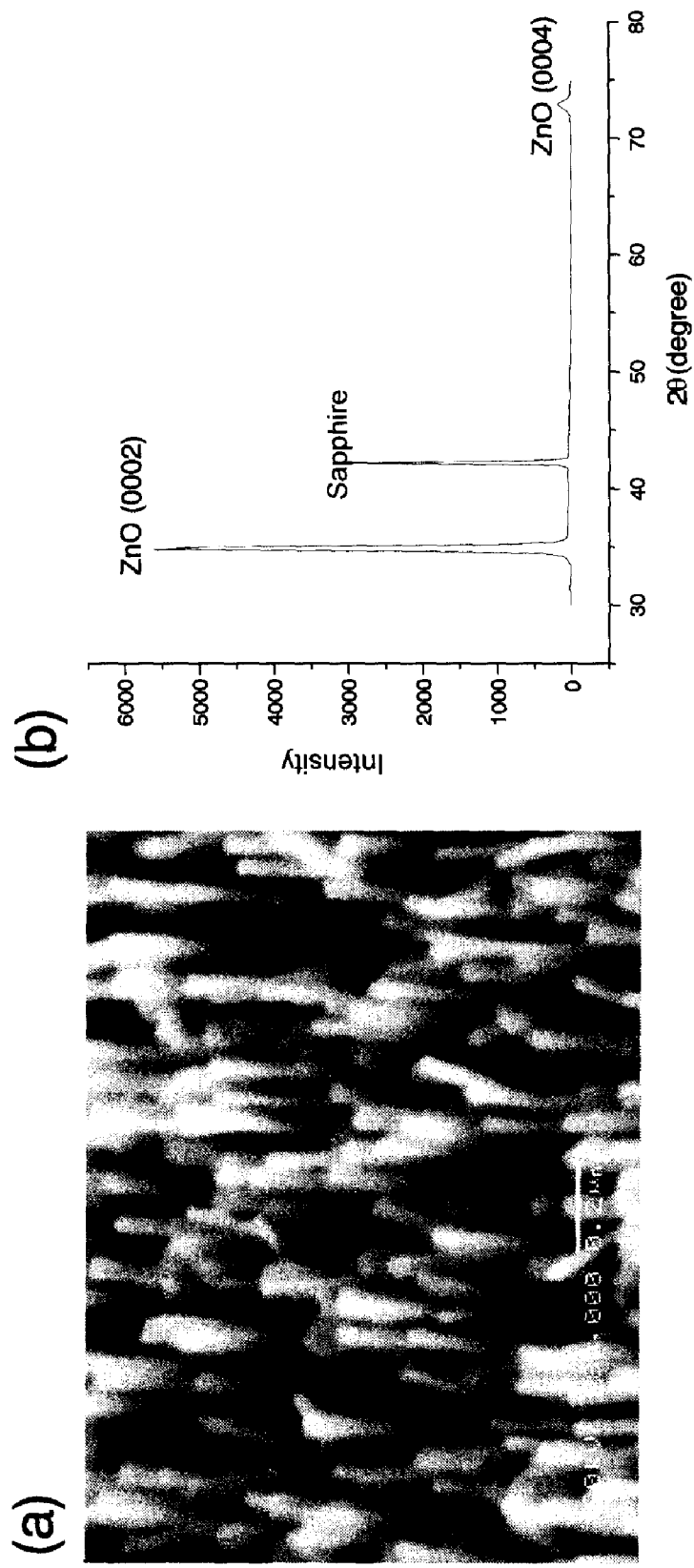
FIG. 6(a) is an SEM image of ZnO nanorods.
FIG. 6(b) is an XRD pattern showing that the nanorods are mostly aligned along the c direction.

FIG. 6(a) shows an SEM image of a ZnO nanorod sample. The nanorods have a very narrow range of diameter, ranging from 20-60 nm, and an average length of about 200-300 nm. FIG. 6(b) displays an XRD θ-2θ scan of the sample, which shows a predominant ZnO (0002) reflection, indicating that the nanorods are well-aligned along the c direction.

Example of Switching Growth Mode

Figure 7:
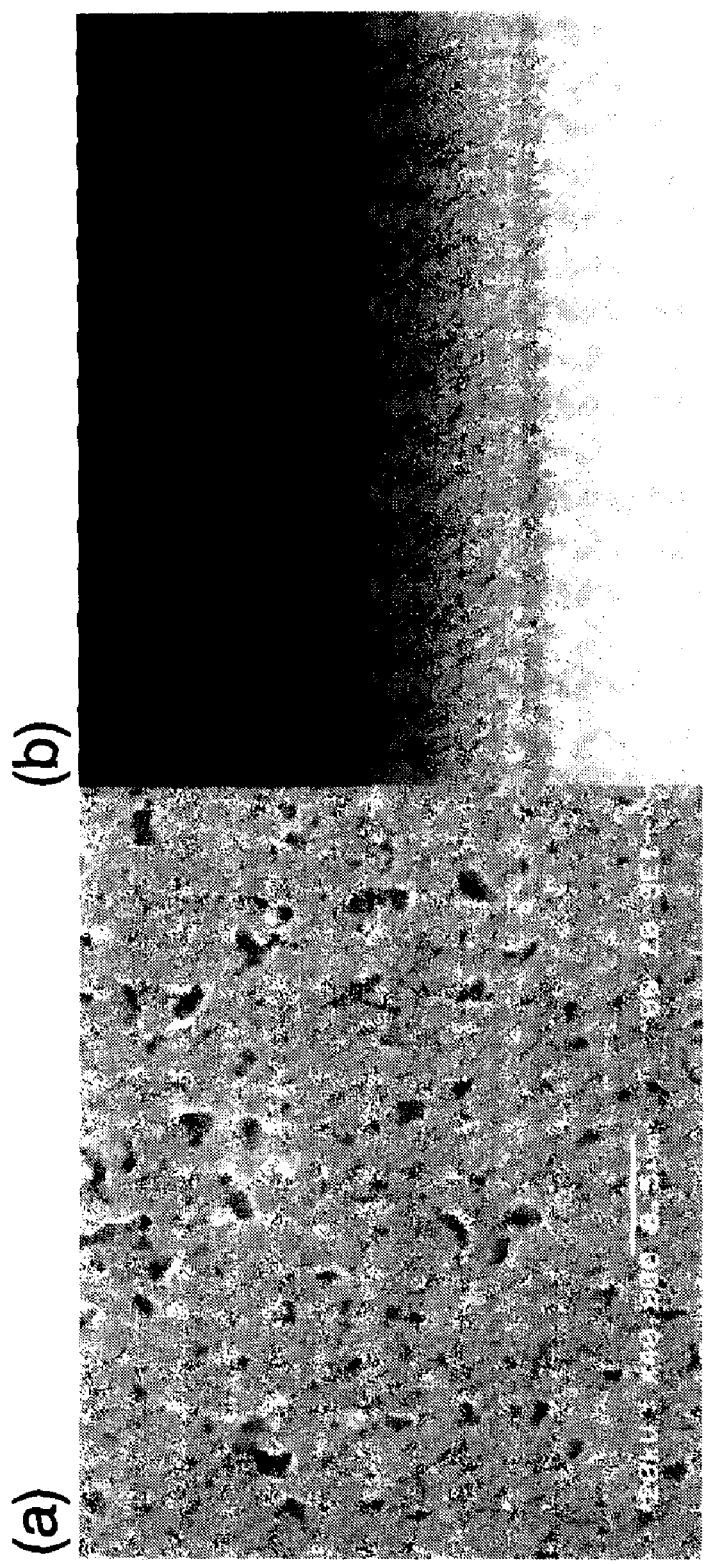
FIG. 7(a) is an SEM image showing the surface of a 2D thin film of ZnO.
FIG. 7(b) is an SEM image showing the cross-section of the 2D thin film. A smooth surface is evident.

The above example demonstrates that a seed layer made of aggregation of nanoparticles is critical to the nanorod growth, and a low laser fluence below the plasma threshold $F_{th}$ is important to produce the seed layer. On the other hand, if a high fluence that is several times $F_{th}$ and can fully vaporize the ablated material is used throughout the two growth steps, it is possible to achieve a 2D growth mode and obtain smooth thin films. FIGS. 7(a) and 7(b) are SEM images of the surface and cross-section, respectively, of a ZnO thin film grown on sapphire (0001) following such principles. Except for a number of pits, which are common in the epitaxy of large lattice-mismatched film/substrate systems, the film surface is satisfactorily smooth. The growth procedure is as follows.

The substrate is first out-gassed and cleaned in an oxygen plasma. A low temperature buffer layer is then deposited at 200-400° C. to reduce the lattice mismatch between the substrate and the main layer. The temperature is then raised to 600° C. for the main layer growth. The major difference between the 2D growth described in this example and the 1D growth described in the previous example is the laser fluence used in the first growth step: in the current example of 2D growth, a high fluence of 8 J/cm$^2$ is used in the first step to grow a buffer layer, while in the example of 1D growth, a low fluence of 0.5 J/cm$^2$ is used in the first step to grow a seed layer.

It is worth noting that in the case of 2D thin film growth, the deposition can be performed with or without nitrogen, i.e., nitrogen does not change the growth mode as long as the first step of deposition is not to create a polycrystalline seed layer. In fact, supplying a small amount (a few militorr) of nitrogen during 2D growth can even make the film slightly smoother. This is very different from the case of nanorod growth, where, in addition to the polycrystalline seed layer, nitrogen is the other necessary factors for the nanorod formation. This further emphasizes the role of the seed layer as a critical factor in determining the growth mode.

Example of Nano-Porous Film Growth

The above two examples demonstrate the effectiveness of controlling the growth mode by varying the laser fluence. The critical factor behind this is the different amount of small particles in the ablation plume, which depends on the laser fluence. Particularly, when the fluence is below the plasma formation threshold $F_{th}$, there is a large fraction of nanoparticles that can be used to form the seed layer for nanorod growth. At high fluences, the mass fraction of gas phase in the plume increases fast and eventually dominates the total mass of the ablated material.

Figure 8:
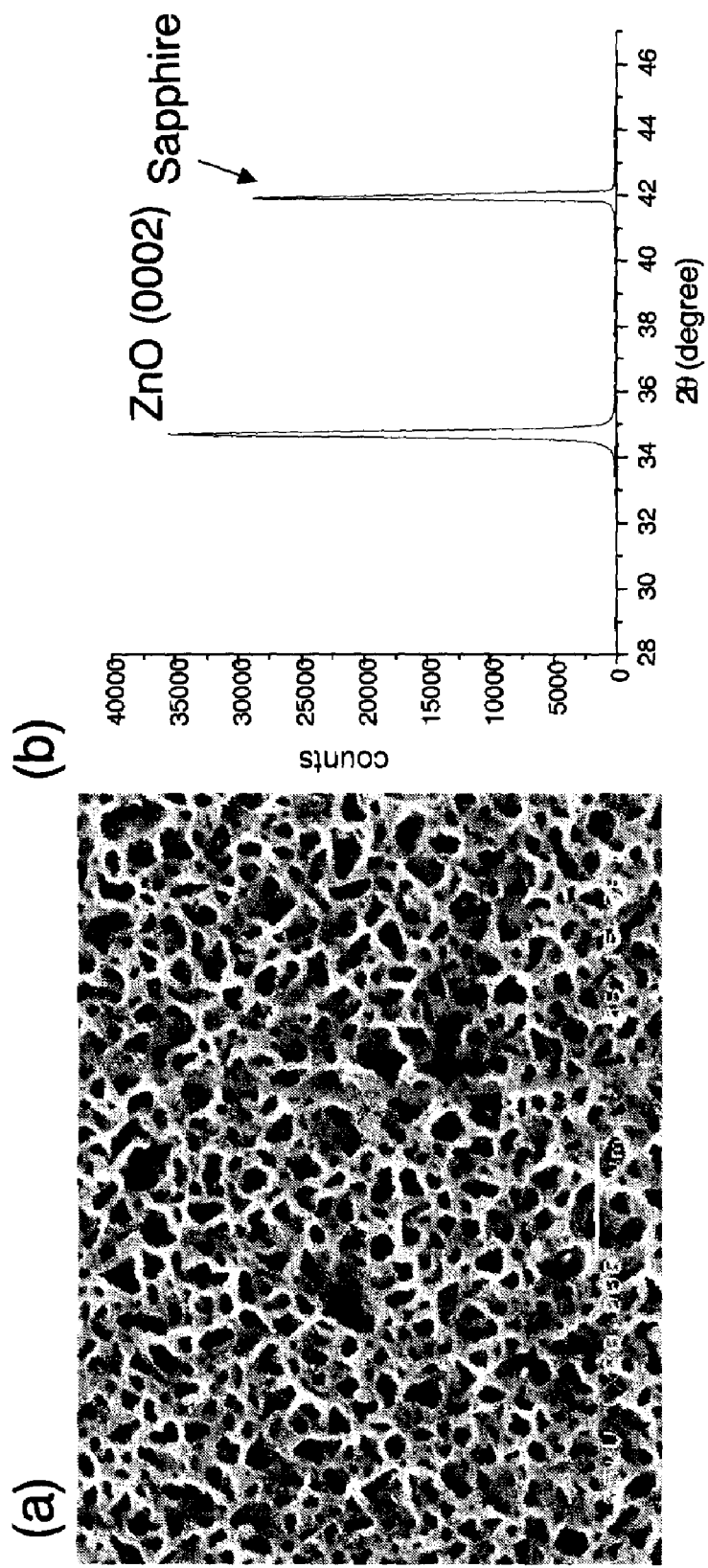
FIG. 8(a) is an SEM image of a nano-porous ZnO film.
FIG. 8(b) is an XRD pattern of the nanoporous film, showing that the film is still highly textured and c-oriented.

Regarding the amount of particles in the plume, in a previous work [B. Liu et al., Applied Physics Letters, Vol 90 (2007), 044103] of the inventors of the current invention, it is reported that even at high fluences up to 10 J/cm$^2$, the plume still contains a small amount of small particles. These particles will also affect the growth mode, especially at high growth temperatures. FIG. 8(a) shows a highly porous ZnO film grown at a high temperature of 700° C. using a laser fluence of 6 J/cm$^2$. Note that this fluence is ten times higher than $F_{th}$ for ZnO. The highly porous morphology of the film is due to the residual amount of small particles, which can cause local structural disruption and strain in the film. At a high substrate temperature, when the atoms become mobile enough, they can diffuse away from the strained area. This opens a large number of small holes and results in the porous morphology. This effect is especially prominent when the substrate has a close lattice match to ZnO, for example, when using MgO substrates. Alternatively, a thin layer of MgO can be first deposited on a sapphire substrate to achieve a close lattice match to ZnO.

FIG. 8(b) shows an XRD pattern of the film. It is evident that the film is still highly textured and oriented along the c direction. Note that the average scale of porosity of the film is on the order of a few hundreds of nanometers. The high specific surface area (and large porous volume) of this nanoscale porous film is a highly desired feature in many applications, such as sensors, catalysis (photocatalysis), magnetism, capacitors, optoelectronics, and energy storage.

In summary, the inventors have discovered new and improved techniques for forming nanorods or various films using an ultrafast PLD technique, whose enabling factors for each growth made may be reiterated as follows.

1. 1D Nanorod Growth
   a. A seed layer deposited using a low laser fluence (near or below the plasma formation threshold $F_{th}$) and annealed at an elevated temperature ($\geqq 500°$ C.) for an extended time ($\geqq 10$ min).
   b. Background nitrogen of 1-50 militorr.
2. 2D Thin Film Growth
   a. A high fluence (several times higher than $F_{th}$) to fully vaporize the ablated material throughout the whole deposition process.
3. Nanoporous Film Growth
   a. A medium to high laser fluence
   b. A substrate with a close lattice match to the film.

All patents, patent applications and literature references referred to in this text are hereby incorporated by reference herein.

Although several embodiments of the invention have been described above, it is evident that further variations are possible as will be readily appreciated by those of skill in the art, and it will also be recognized that the embodiments may be usable together. Further, also the present text focuses on ZnO in particular, it will be recognized that the invention is applicable to other materials, and that with the apparatus of the invention, it is further possible to form films and nanorods of multiple materials within the same sample or on the same substrate, by substitution of target materials during the process of formation.

It is intended that the invention be limited only by the claims which follow, and not by the specific embodiments and their variations and combinations as described hereinabove.

What is claimed is:

1. A method of producing compound nanorods without employing external catalyst, comprising:
    using an ultrafast pulsed laser to ablate portions of a solid target comprising a compound material;
    depositing a first portion of ablated target material onto a substrate to form a seed layer, wherein the first portion deposited onto the substrate comprises nanoparticles, and wherein a fluence provided with at least one ultrafast pulse that ablates target material is substantially lower than a plasma threshold of the target material;
    annealing the substrate to improve the crystallinity of the seed layer; and
    depositing a second portion of ablated target materials onto the seeded substrate to form nanorods, wherein the second portion deposited onto the substrate comprises vapor, and wherein a fluence provided with at least one ultrafast pulse that ablates target material is greater than a plasma threshold of the target material.

2. The method of claim 1, where neutral gases are fed into the deposition chamber to be radicalized by the laser ablation plume and participate in the growth.

3. The method of claim 1, wherein for depositing the seed layer, a laser fluence is chosen to be below a predetermined threshold fluence.

4. The method of claim 3, wherein the said predetermined threshold fluence is the plasma formation threshold $F_{th}$ for the target material.

5. The method of claim 3, wherein the said predetermined plasma formation threshold $F_{th}$ of said target material is determined by plotting the ion current collected by an ion probe as a function of the laser fluence, and determining the fluence at which the plot exhibits a distinct change in the slope, below which the ion current becomes vanishing.

6. The method of claim 1, wherein for depositing the seed layer, the laser fluence is chosen to be below $4 \times F_{th}$.

7. The method of claim 1, wherein for depositing the nanorods after the seed layer preparation, the laser fluence is chosen to be above the plasma formation threshold $F_{th}$ of the target material.

8. The method of claim 1, wherein the pulsed laser generates at least one pulse having a pulse duration between 10 fs and 100 ps.

9. The method of claim 1, wherein the pulsed laser generates at least one pulse having a pulse energy between 1 microJ and 100 milliJ.

10. The method of claim 1, wherein the pulsed laser generates pulses at a repetition rate between 1 Hz and 100 MHz.

11. The method of claim 1, wherein the target compound material comprises a metal oxide.

12. The method of claim 1, wherein the target compound material comprises a nitride.

13. The method of claim 1, wherein the target material comprises a metal and the growth occurs through reaction with a reactive gas.

14. The method of claim 1, wherein the said ablation and deposition are performed in an environment having a reactive background gas, the reactive gas selected from a group of reactive gases comprising at least one of oxygen, nitrogen, NH$_3$, NO, NO$_2$, or N$_2$O, supplied either in neutral or in plasma form.

15. The method of claim 1, wherein the target compound material comprises arsenide.

16. The method of claim 1, wherein the substrate temperature for the seed layer and nanorod growth is between room temperature and 1000° C.

17. The method of claim 1, wherein a composite of nanorods of different materials are deposited using different target materials.

18. The method of claim 1, wherein the substrate temperature is above 500° C.

19. The method of claim 16, wherein the substrate temperature for the seed layer and nanorod growth is between 300° C. and 600° C.

20. The method of claim 1, wherein the laser fluence applied to the target material for depositing the first portion is less than the laser fluence applied to the target material for depositing the second portion.

21. A method of producing compound nanorods without employing external catalyst, the method comprising:
    ablating a target material with laser pulses, the laser pulses comprising at least one pulse having a pulse duration in the range from about 10 fs to 100 ps and providing a fluence substantially lower than a plasma threshold of the target material, the fluence sufficiently low such that at least a large portion of ablated material comprises nanoparticles;
    forming a seed layer on a substrate by depositing at least a portion of the nanoparticles on a substrate;
    ablating a target material with laser pulses, at least one pulse having a pulse duration in the range from about 10 fs to 100 ps and providing a sufficiently high fluence such that the ablated material comprises substantially vaporized target material; and
    forming nanorods on the seed layer by depositing at least a portion of the vaporized target material on the seeded layer.

22. The method of claim 21, wherein the sufficiently low fluence is near or below an ablation threshold of the target material.

23. The method of claim 21, wherein the sufficiently low fluence is characterizable by at least one of a weak ion signal and low plume brightness.

24. The method of claim 21, wherein the sufficiently high fluence is greater than an evaporation threshold of the target material.

* * * * *